United States Patent
Yen et al.

(10) Patent No.: US 6,551,883 B1
(45) Date of Patent: Apr. 22, 2003

(54) MOS DEVICE WITH DUAL GATE INSULATORS AND METHOD OF FORMING THE SAME

(75) Inventors: Wen Ping Yen, Hsinchu (TW); Yun Hsiu Chen, Hsinchu (TW); Hung-Cheng Weng, Tainan Hsien (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 0 days.

(21) Appl. No.: 10/026,605

(22) Filed: Dec. 27, 2001

(51) Int. Cl.⁷ .................. H01L 21/4763; H01L 21/336; H01L 21/8234; H01L 21/8238
(52) U.S. Cl. ........................ 438/275; 438/197; 438/199; 438/182; 438/287; 438/261; 438/591; 438/229
(58) Field of Search .................. 438/197, 287, 438/275, 261, 591, 182, 229, 199

(56) References Cited

U.S. PATENT DOCUMENTS

| | | | |
|---|---|---|---|
| 5,275,960 A | * | 1/1994 | Yamaguchi et al. .......... 437/41 |
| 5,888,869 A | * | 3/1999 | Cho et al. ................... 438/258 |
| 5,960,289 A | * | 9/1999 | Tsui et al. ................... 438/275 |
| 6,165,851 A | * | 12/2000 | Satoh .......................... 438/275 |
| 6,180,473 B1 | * | 1/2001 | Hong et al. .................. 438/303 |
| 6,200,834 B1 | * | 3/2001 | Bronner et al. .............. 438/142 |
| 6,228,708 B1 | * | 5/2001 | Chang .......................... 438/253 |
| 6,284,597 B1 | * | 9/2001 | Hong ........................... 438/257 |
| 6,284,637 B1 | * | 9/2001 | Chhagan et al. ............. 438/594 |
| 6,333,222 B1 | * | 12/2001 | Kitazawa et al. ............ 438/241 |
| 6,333,541 B1 | * | 12/2001 | Matsuoka et al. ............ 257/391 |

FOREIGN PATENT DOCUMENTS

| | | | |
|---|---|---|---|
| JP | 403108314 A | * | 5/1991 |
| JP | 406104432 A | * | 4/1994 |
| JP | 406120500 A | * | 4/1994 |
| JP | 406252165 A | * | 9/1994 |

* cited by examiner

Primary Examiner—Caridad Everhart
Assistant Examiner—Chuong A Luu
(74) Attorney, Agent, or Firm—Birch, Stewart, Kolasch & Birch, LLP

(57) ABSTRACT

A MOS device with dual gate insulators has a first gate insulator formed on a predetermined area of a semiconductor substrate, and a second gate insulator formed outside the predetermined area of the semiconductor substrate to surround the first gate insulator. The second gate insulator is thicker than the first gate insulator. In addition, a gate electrode layer is patterned on the dual gate insulators. The bottom center of the gate electrode layer covers the first gate insulator, and the bottom edge of the gate electrode layer extends to cover the second gate insulator.

7 Claims, 8 Drawing Sheets

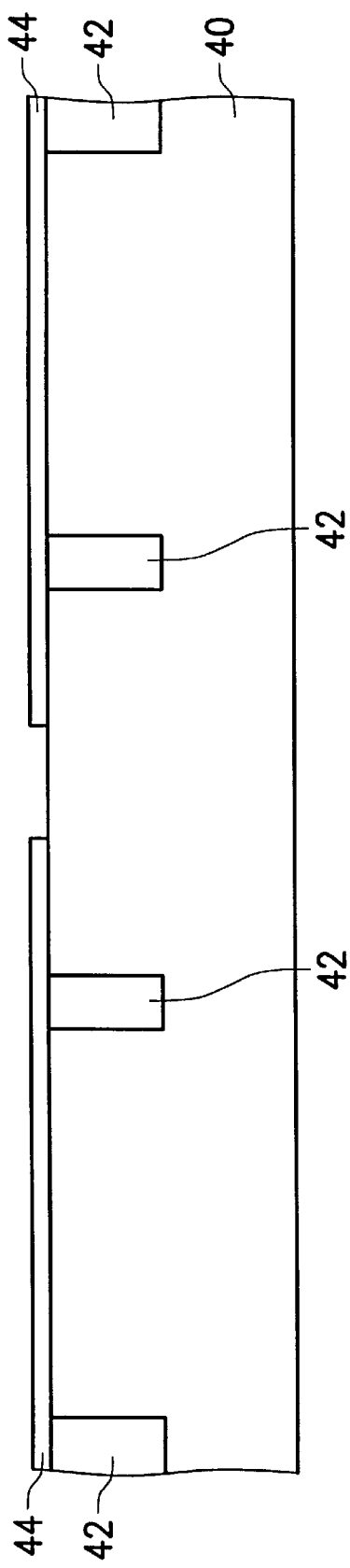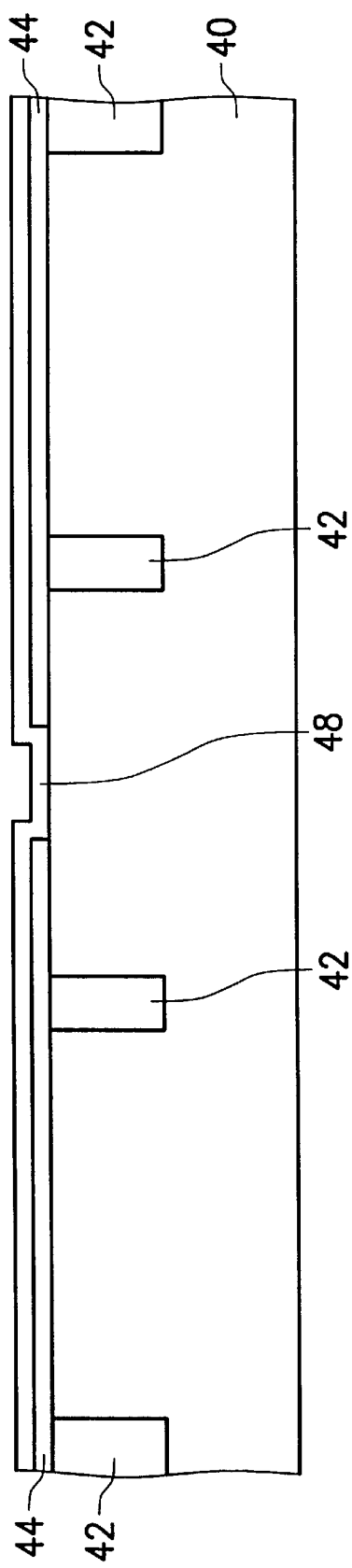

MOS DEVICE WITH DUAL GATE INSULATORS AND METHOD OF FORMING THE SAME

BACKGROUND OF THE INVENTION

1. Field of the Invention

The present invention relates to a metal-oxide-semiconductor (MOS) device process and, more particularly, to a MOS device with dual gate insulators and a method of forming the same.

2. Description of the Related Art

In highly integrated VLSI or ULSI processing, high-voltage (HV) MOS devices and low-voltage (LV) MOS devices are formed within the active areas and HV I/O devices are formed in the peripheral circuit areas. Since the HV MOS device has a longer channel length and a thicker gate insulator in comparison with the LV MOS device, how to provide two gate insulators of different thickness becomes an important problem to be solved.

FIGS. 1A to 1E are sectional diagrams showing a method of forming HV MOS devices and LV MOS devices according to the prior art. As shown in FIG. 1A, a semiconductor substrate 10 has a plurality of shallow trench isolation regions 12 for separating adjacent active areas, such as a HV MOS device region I and a LV MOS device region II. As shown in FIG. 1B, a first oxide layer 14 is formed on the entire surface of the substrate 10, and then photolithography and etching are employed to remove the first gate oxide layer 14 within the LV MOS device region II, thus the first oxide layer 14 only remains on the HV MOS device region I. Next, a second oxide layer 16 is formed on the entire surface of the substrate 10 to cover the first oxide layer 14 and the exposed area of the substrate 10. Therefore, the stacked structure consisting of the first oxide layer 14 and the second oxide layer 16 within the HV MOS device region I serves as a thick gate oxide insulator of the HV MOS device. Also, the second oxide layer 16 within the LV MOS device region II serves as a thin gate oxide insulator of the LV MOS device. Thereafter, as shown in FIG. 1C, after depositing a polysilicon layer on the substrate 10, photolithography and etching are employed to pattern the polysilicon layer as a first gate electrode layer 18 in the HV MOS device region I and a second gate electrode layer 20 in the LV MOS device region II.

As the channel length is scaling down, hot-carrier effect has indeed become a significant problem in NMOS devices, especially when the channel length is smaller than 1.5 $\mu$m. Lightly doped drains (LDD) structure is one way to solve this problem. As shown in FIG. 1D, using lightly-doped ion implantation with the gate electrode layers 18 and 20 as the mask, a lightly-doped region 22 is formed in the substrate 10 and surrounds the gate electrode layers 18 and 20. Then, as shown in FIG. 1E, using deposit, photolithography and anisotropic etching, a sidewall spacer 24 is formed on the sidewalls of the gate electrode layers 18 and 20. Next, using heavily-doped ion implantation with the gate electrode layers 18 and 20 and the sidewall spacer 24 as the mask, a heavily doped region 26 is formed in the exposed area of the lightly doped region 22 to serve as a source/drain electrode region. The remaining lightly doped region 22 serves as an LDD structure. Thus, the HV MOS device completed within the HV MOS device region I has a channel length $d_I$ longer than a channel length $d_{II}$ of the LV MOS device completed within the LV MOS device region II.

SUMMARY OF THE INVENTION

The present invention provides a MOS device with dual gate insulators and a method of forming the same to solve the problems mentioned in the prior art.

The MOS device with dual gate insulators has a first gate insulator formed on a predetermined area of a semiconductor substrate, and a second gate insulator formed outside the predetermined area of the semiconductor substrate to surround the first gate insulator. The second gate insulator is thicker than the first gate insulator. In addition, a gate electrode layer is patterned on the dual gate insulators. The bottom center of the gate electrode layer covers the first gate insulator, and the bottom edge of the gate electrode layer extends to cover the second gate insulator.

Accordingly, it is a principal object of the invention to increases the channel length of the MOS device.

It is another object of the invention to improve the lateral electric field near the drain junction.

Yet another object of the invention is to improve the vertical electric field near the drain junction.

It is a further object of the invention to diminish a parasitic capacitance at the bottom corner of the gate electrode.

Still another object of the invention is to overcome hot-carrier effect without fabricating an LDD structure.

Another object of the invention is to reduce process time and costs.

These and other objects of the present invention will become readily apparent upon further review of the following specification and drawings.

BRIEF DESCRIPTION OF THE DRAWINGS

FIGS. 3A to 3H are sectional diagrams showing a method of forming a MOS DEVICE with dual gate insulators according to the present invention.

Similar reference characters denote corresponding features consistently throughout the attached drawings.

DETAILED DESCRIPTION OF THE PREFERRED EMBODIMENTS

Figure 1A:
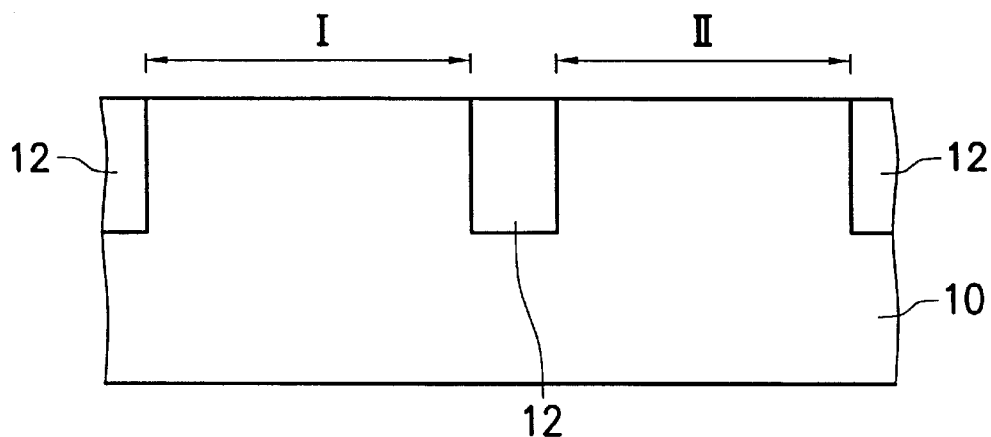
FIGS. 1A to 1E are sectional diagrams showing a method of forming HV MOS devices and LV MOS devices according to the prior art.
Figure 1B:
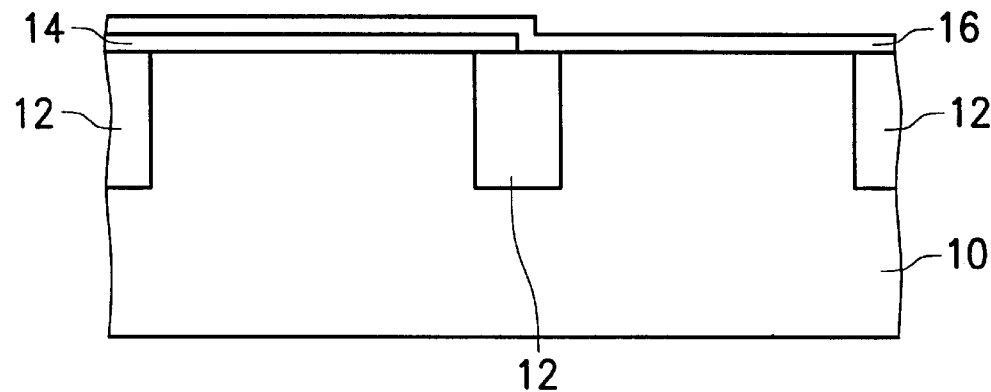
Figure 1C:
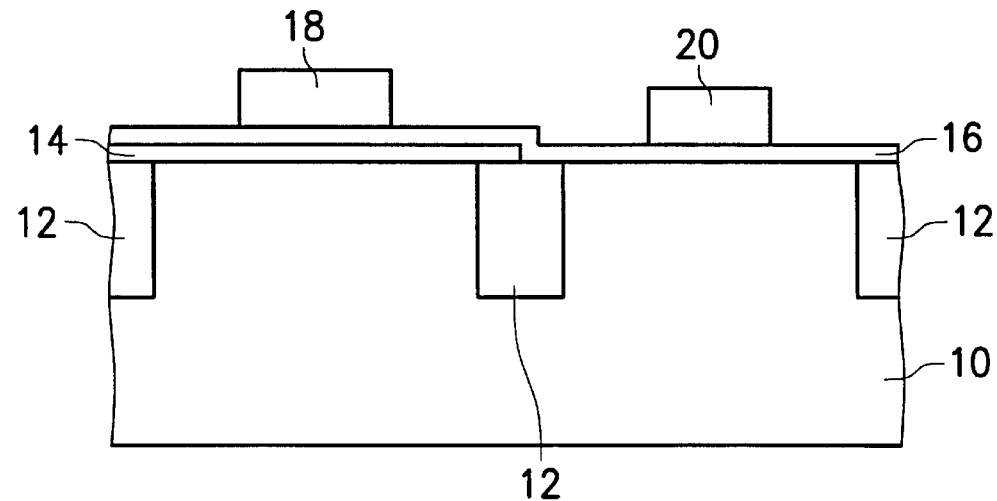
Figure 1D:
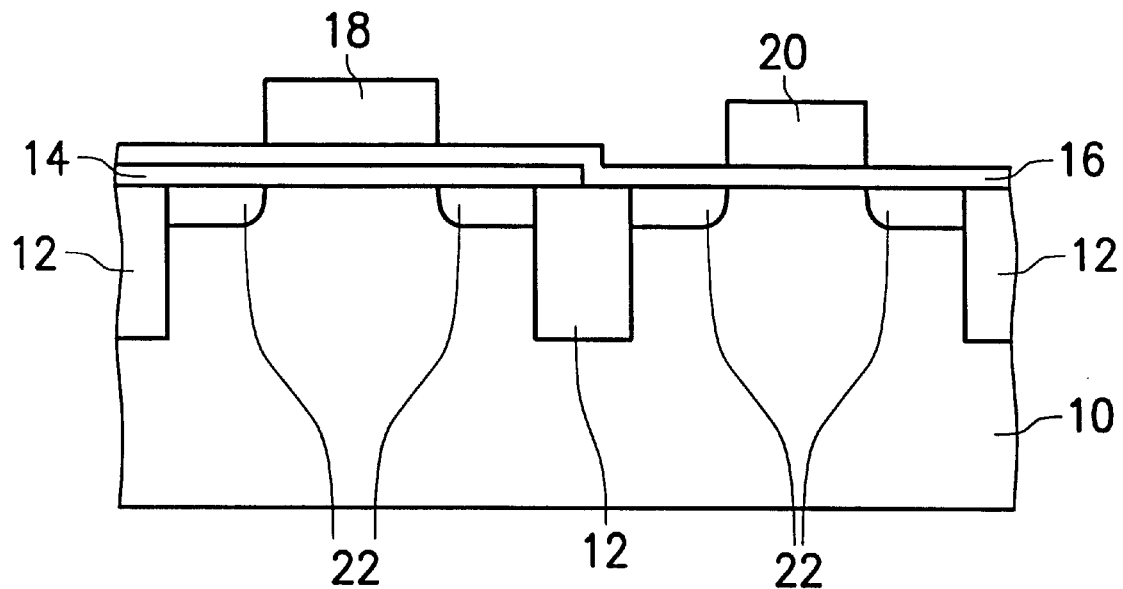
Figure 1E:
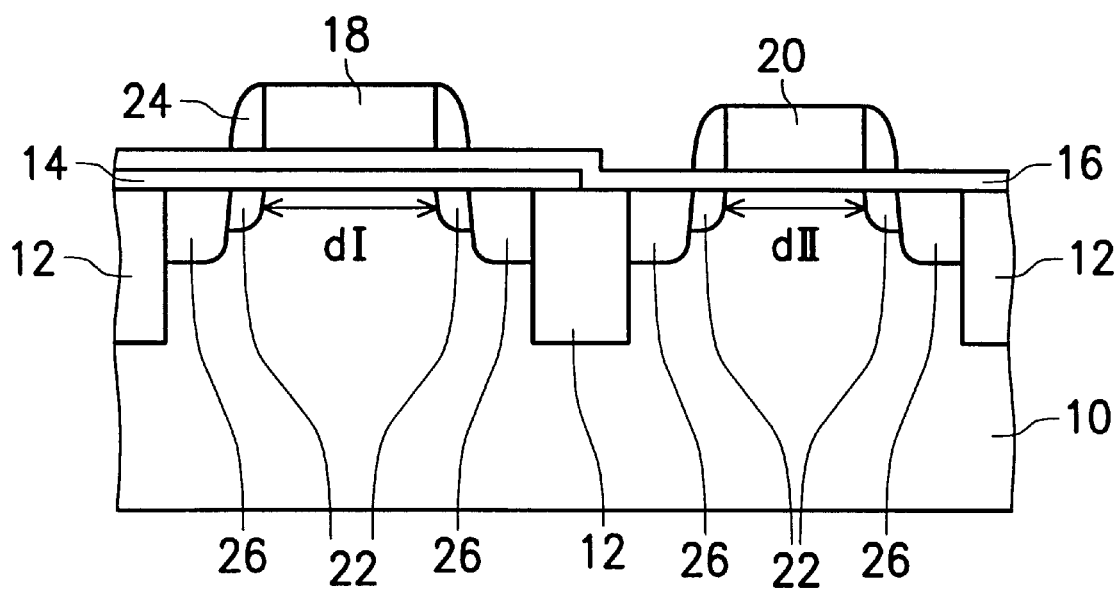
Figure 2:
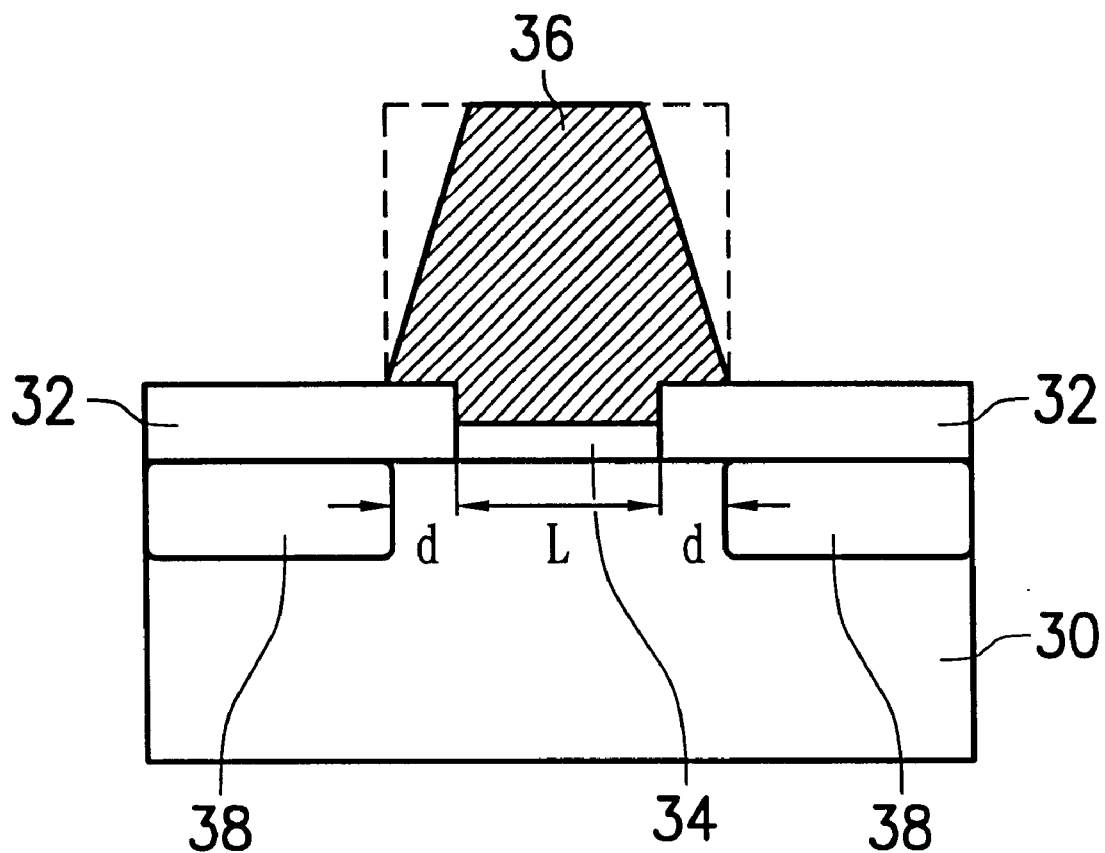
FIG. 2 is a sectional diagram showing a MOS device with dual gate insulators according to the present invention.

FIG. 2 is a sectional diagram showing a MOS device with dual gate insulators according to the present invention. A semiconductor substrate 30 comprises a thick gate insulator 32, a thin gate insulator 34, a gate electrode layer 36 patterned on the gate insulators 32 and 34, and a source/drain electrode region 38 formed in the substrate 30 and surrounding the gate electrode layer 36. The thin gate insulator 34 has a width L and covers a predetermined area of the substrate 30. The thick gate insulator 32 surrounds the thin gate insulator 34 to cover the non-predetermined area of the substrate 30. The gate electrode layer 36 may be formed as a trapezoid profile with inclined sidewalls, or a square profile with vertical sidewalls as shown by the dotted line. It is noticed that the bottom center of the gate electrode layer 36 covers the thin gate insulator 34 for the distance L, and the bottom edge of the gate electrode layer 36 extends to cover a part of the thick gate insulator 32 for the distance d. Therefore, the lateral distance between the source/drain electrode regions 38 is L+2d. This increases the channel length of the MOS device and improves the lateral electric field near the drain junction. Also, this increases the distance between the edge of the gate electrode layer 36 and the source/drain electrode region 38 to improve the vertical electric field near the drain junction, thus diminishes a parasitic capacitance at the bottom corner of the gate electrode layer 36. Accordingly, the MOS device can overcome hot-carrier effect without fabricating an LDD structure. Therefore, lightly doped ion implantation and sidewall spacer processes comprising deposit, photolithography and etching can be omitted to reduce process time and costs. Furthermore, the MOS device with dual gate insulators can be applied to LV MOD devices, HV MOS devices and I/O devices for improving the electric field distribution near the edge of the gate electrode and preventing hot-carrier effect from a reduced channel length.

Figure 3A:
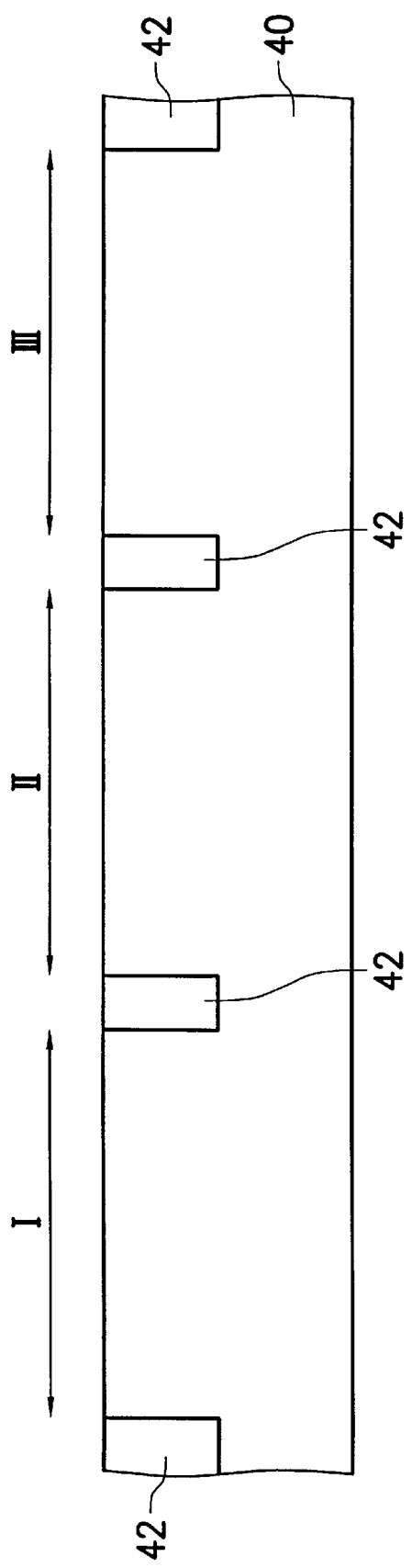
Figure 3B:
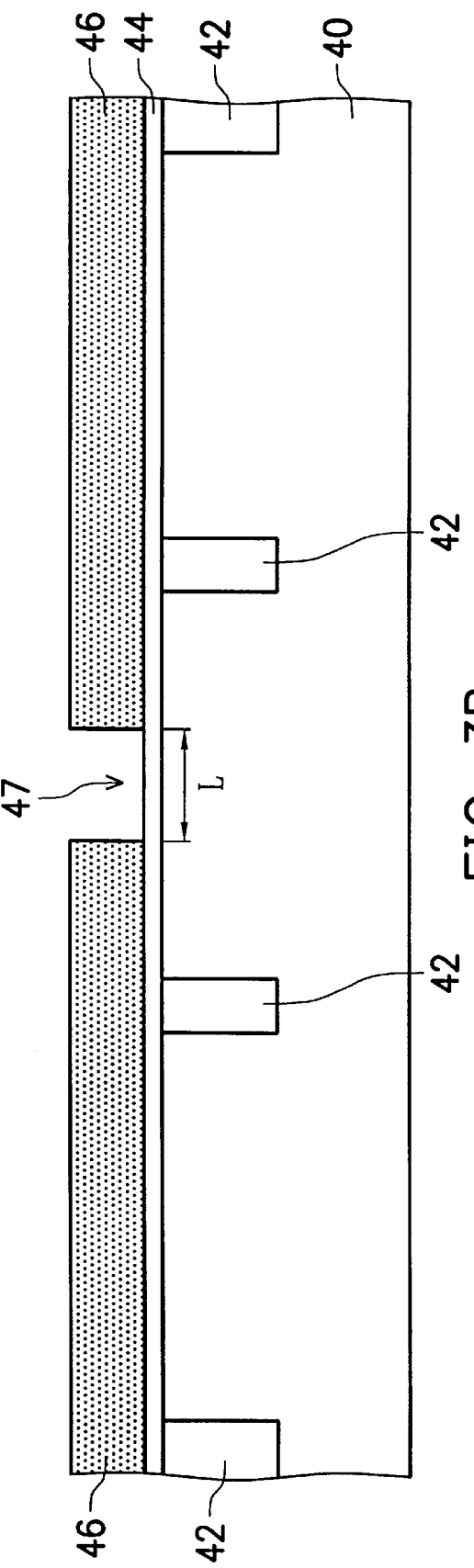

The above-described MOS device with dual gate insulators is preferably applied to a LV MOS device. Hereinafter, the present invention provides a method of integrating the formation of the above-described MOS device with dual gate insulators into the general HV MOS process. FIGS. 3A to 3H are sectional diagrams showing a method of forming a MOS DEVICE with dual gate insulators according to the present invention. As shown in FIG. 3A, a semiconductor substrate 40 comprises a plurality of shallow trench isolation regions 42 for separating adjacent active areas, such as a HV MOS device region I, a LV MOS device region II and a peripheral circuit region III. As shown in FIG. 3B, thermal oxidation or general deposition may be employed to form a first oxide layer 44 on the substrate 40. Then, a first photoresist layer 46 with an opening 47 is patterned on the first oxide layer 44, in which the opening 47 is used to define a thin gate insulator of a width L within the LV MOS device region II in subsequent processes. Then, as shown in FIG. 3C, the first oxide layer 44 exposed in the opening 47 is etched to exposed a predetermined area of the substrate 40, and then the first photoresist layer 46 is removed.

Next, as shown in FIG. 3D, a second oxide layer 48 is formed on the entire surface of the substrate 40 to cover the first oxide layer 44 and the exposed substrate 40. Thus, in the HV MOS device region I and the peripheral circuit region III, the stacked structure consisting of the first oxide layer 44 and the second oxide layer 48 serves as a gate insulator. Also, in the LV MOS device region II, the second oxide layer 48 serves as a thin gate insulator, and the stacked structure of the first oxide layer 44 and the second oxide layer 48 serves as a thick gate insulator.

Figure 3E:
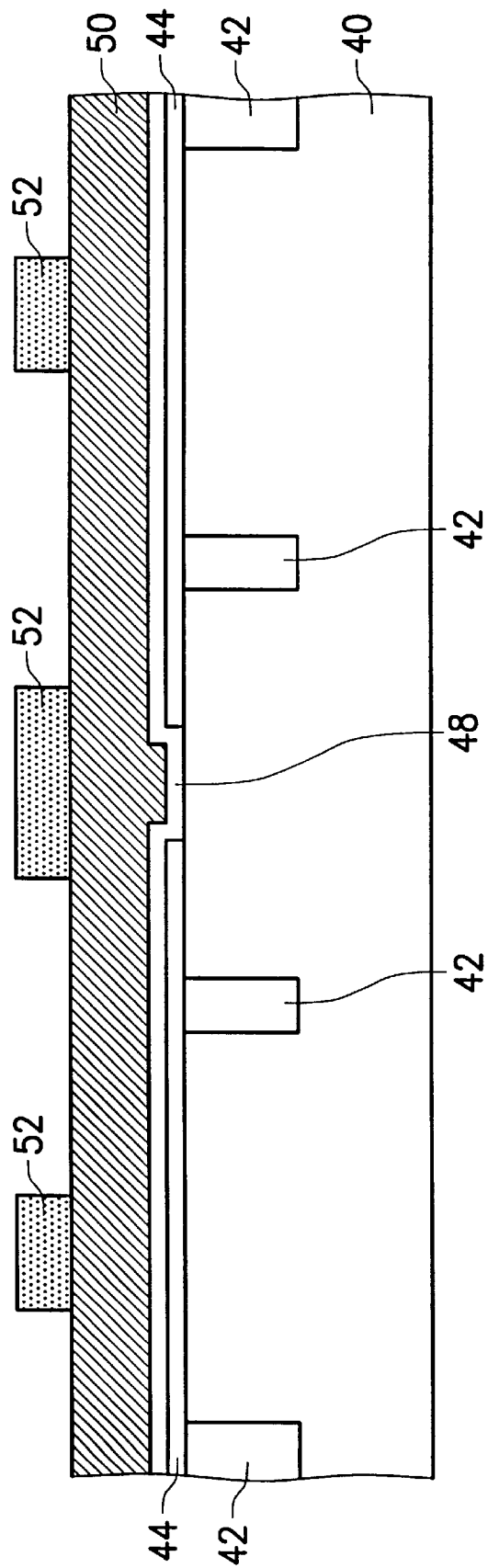
Figure 3F:
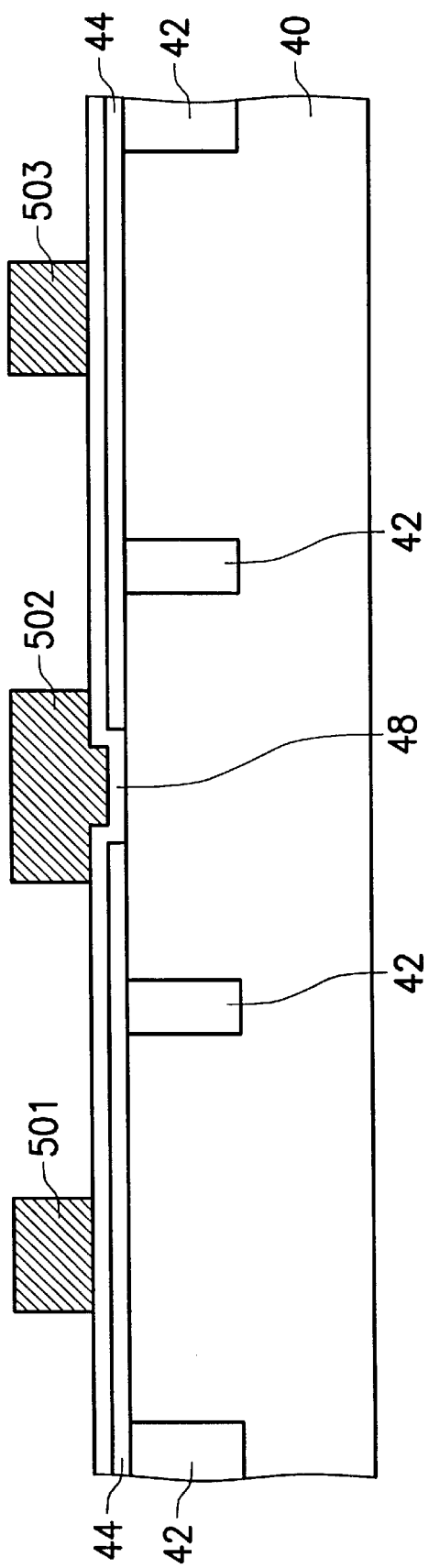

Thereafter, as shown in FIG. 3E, a polysilicon layer 50 and a second photoresist layer 52 with a predetermined pattern are successively formed on the entire surface of the substrate 40. Next, as shown in FIG. 3F, photolithography and etching are used to pattern the polysilicon layer 50 as gate electrode layers, and then the second photoresist layer 52 is removed. This completes a first gate electrode layer 501 in the HV MOS device region I, a second gate electrode layer 502 in the LV MOS device region II, and a third gate electrode layer 503 in the peripheral circuit region III. It is noticed that the bottom center of the second gate electrode layer 502 covers the thin gate insulator, and the bottom edges of the second gate electrode layer 502 extend to cover the thick gate insulator.

Figure 3G:
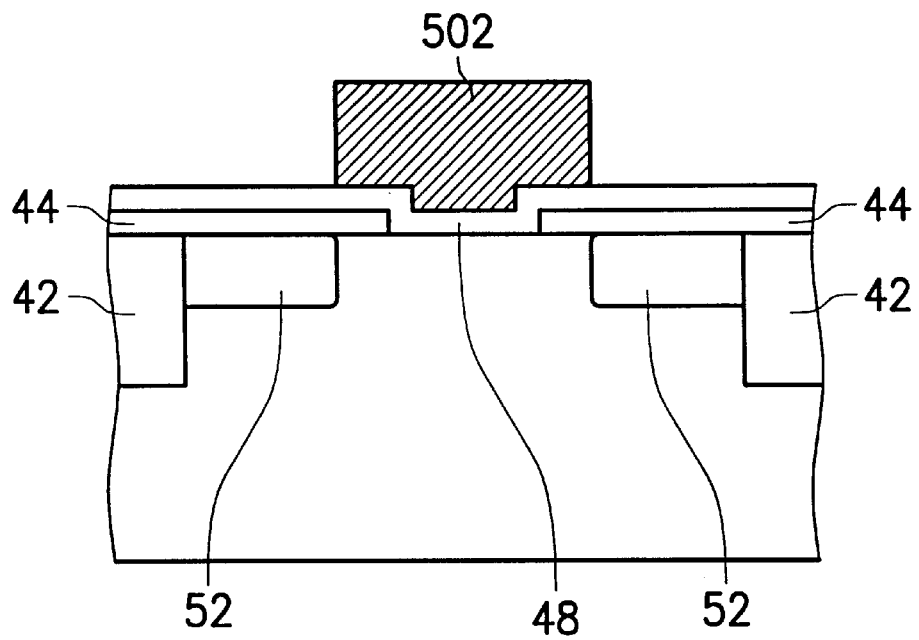
Figure 3H:
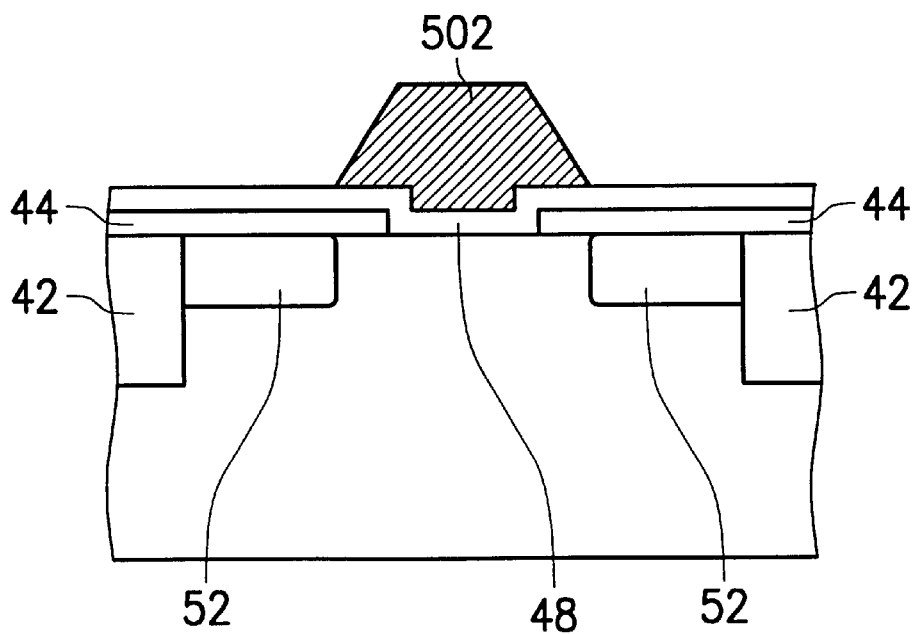

In the subsequent processes, the formation of sidewall spacers, LDD structures and source/drain electrode regions can proceed in the HV MOS device region I and the peripheral circuit region III depending on the concerns of electrical properties and process requirements. FIGS. 3G and 3H shows the results in the LV MOS device region II. The second gate electrode layer 502 may be formed as a square profile with vertical sidewalls as shown in FIG. 3G, or a trapezoid profile with inclined sidewalls by tuning etching parameters as shown in FIG. 3H. Also, using ion implantation as the second gate electrode layer 502 as the mask, source/drain regions 52 are formed in the substrate 40 and surround the second gate electrode layer 502. Since the bottom edge of the second gate electrode layer 502 extends to cover the thick gate insulator, the lateral distance between the source/drain regions 52, the channel length of the LV MOS device, is increased to solve the problem of hot-carrier effect. Furthermore, lightly doped ion implantation and sidewall spacer processes comprising deposit, photolithography and etching are omitted to reduce process time and costs.

It is to be understood that the present invention is not limited to the embodiments described above, but encompasses any and all embodiments within the scope of the following claims.

What is claimed is:

1. A method of forming a MOS device with dual gate insulators, comprising steps of:

providing a semiconductor substrate having a region;

forming a first insulator on a first area of the regions leaving an exposed semiconductor substrate area as a second area of the region;

forming a second insulator to cover the first insulator and the exposed semiconductor substrate, wherein the second insulator on the second area of the region serves as a thin gate insulator and the stacked structure of the second insulator and the first insulator on the first area of the region serves as a thick gate insulator; and forming a gate electrode layer on the second insulator, wherein the bottom center of the gate electrode layer covers the thin gate insulator and the bottom edge of the gate electrode layer extends to cover the thick gate insulator.

2. The method according to claim 1, wherein the gate electrode layer has a square profile with vertical sidewalls.

3. The method according to claim 1, wherein the gate electrode layer has a trapezoid profile with tapered sidewalls.

4. The method according to claim 1, further comprising a step of forming a source/drain electrode region in the semiconductor substrate and surrounds the gate electrode layer.

5. The method according to claim 1, wherein the formation of first gate insulator comprises steps of:

forming the first insulator on the semiconductor substrate;

forming a first photoresist layer with, an opening on the first insulator, wherein the opening expose the first insulator; and removing the first insulator exposed in the opening.

6. The method according to claim 1, wherein the first insulator and the second insulator are silicon oxide.

7. The method according to claim 1, wherein the gate electrode layer is polysilicon.

* * * * *